United States Patent
Ikeda et al.

(10) Patent No.: US 7,579,677 B2
(45) Date of Patent: Aug. 25, 2009

(54) SEMICONDUCTOR DEVICE AND METHOD FOR MANUFACTURING THEREOF

(75) Inventors: Osamu Ikeda, Yokohama (JP); Masahide Okamoto, Yokohama (JP); Hidemasa Kagii, Takasaki (JP); Hiroi Oka, Tamamura (JP); Hiroyuki Nakamura, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 155 days.

(21) Appl. No.: 11/585,879

(22) Filed: Oct. 25, 2006

(65) Prior Publication Data

US 2007/0089811 A1    Apr. 26, 2007

(30) Foreign Application Priority Data

Oct. 26, 2005    (JP) .............................. 2005-311047

(51) Int. Cl.
     *H01L 23/495* (2006.01)
(52) U.S. Cl. .................................. 257/676; 257/E23.04
(58) Field of Classification Search ......... 257/735–738, 257/772, 762–765, 779–780, E23.171, E23.175, 257/E23.178, 676, 783, 782; 438/119, 666–667, 438/117, 118
See application file for complete search history.

(56) References Cited

U.S. PATENT DOCUMENTS 5,465,007 A * 11/1995 Ikeda et al. .................. 257/584
6,727,587 B2 * 4/2004 Riedl .......................... 257/748
2005/0153532 A1 * 7/2005 Osenbach et al. ........... 438/611

OTHER PUBLICATIONS

William W. So, et al., "High Temperature Joints Manufactured at Low Temperature", Proceeding of Electrical and Computer Engineering, University of California, Irvine, CA 92697-2625, pp. 284-291, 1998.

Yamamoto, et al., "Reactivity to Form Intermetallic Compounds in the Micro Joint Using Sn-Ag Solder", Abstract of MES 2003, Oct. 2004, p. 45.

* cited by examiner

*Primary Examiner*—Wai-Sing Louie
*Assistant Examiner*—Bilkis Jahan
(74) *Attorney, Agent, or Firm*—Antonelli, Terry, Stout & Kraus, LLP.

(57) ABSTRACT

In a power semiconductor device, a joint between the power semiconductor element and frame plated with Ni is composed of a laminated structure comprising, from the power semiconductor element side, an intermetallic compound layer having a melting point of 260° C. or higher, a Cu layer, a metal layer having a melting point of 260° C. or higher, a Cu layer and an intermetallic layer having a melting point of 260° C. or higher. The structure of the joint buffers the stress generated by the secondary mounting and temperature cycle at the bond for the semiconductor element and the frame having a large difference in thermal expansion coefficient from each other.

6 Claims, 8 Drawing Sheets

| JOINT STRUCTURE | BONDING TEMPERATURE | HOLDING TIME | | | | | |
|---|---|---|---|---|---|---|---|
| | | 1min. | 3min. | 5min. | 10min. | 30min. | 60min. |
| Si/Sn(20 μm) / Cu | 300°C | × | × | × | × | ○ | ○ |
| | 350°C | × | × | × | ○ | ○ | ○ |
| | 400°C | × | × | × | ○ | ○ | ○ |
| Si/Sn-3.5Ag(20 μm) / Cu | 300°C | × | × | × | ○ | ○ | ○ |
| | 350°C | × | × | × | ○ | ○ | ○ |
| | 400°C | × | × | × | ○ | ○ | ○ |
| Si/Sn-0.7Cu(20 μm) / Cu | 300°C | × | × | × | × | ○ | ○ |
| | 350°C | × | × | × | ○ | ○ | ○ |
| | 400°C | × | × | × | ○ | ○ | ○ |
| Si/Sn-3Ag-0.5Cu(20 μm) / Cu | 300°C | × | × | × | ○ | ○ | ○ |
| | 350°C | × | × | × | ○ | ○ | ○ |
| | 400°C | × | × | × | ○ | ○ | ○ |
| Si/In-48Sn(20 μm) / Cu | 300°C | × | × | × | ○ | ○ | ○ |
| | 350°C | × | × | × | ○ | ○ | ○ |
| | 400°C | × | × | × | ○ | ○ | ○ |

FIG. 10

| No. | | STRUC-TURE | FRAME | CONSTRUCTION OF COMPOSITE FOIL | REFLOW | T-CYCLE |
|---|---|---|---|---|---|---|
| EXAMPLE | 1 | FIG.3 | Ni PLATED Cu-BASED | Sn/Cu/Invar Alloy/Cu/Sn=20 μm/33.3 μm/33.3 μm/33.3 μm/20 μm | 0/20 | 0/20 |
| | 2 | FIG.3 | Ni PLATED Cu-BASED | Sn-Ag/Cu/Invar Alloy/Cu/Sn-Ag=20 μm/33.3 μm/33.3 μm/33.3 μm/20 μm | 0/20 | 0/20 |
| | 3 | FIG.3 | Ni PLATED Cu-BASED | Sn-Cu/Cu/Invar Alloy/Cu/Sn-Cu=20 μm/33.3 μm/33.3 μm/33.3 μm/20 μm | 0/20 | 0/20 |
| | 4 | FIG.3 | Ni PLATED Cu-BASED | Sn-Ag/Cu/Al/Cu/Sn-Ag=20 μm/10 μm/100 μm/10 μm/20 μm | 0/20 | 0/20 |
| | 5 | FIG.3 | Ni PLATED 42 ALLOY-BASED | Sn-Ag/Cu/Invar Alloy/Cu/Sn-Ag=20 μm/33.3 μm/33.3 μm/33.3 μm/20 μm | 0/20 | 0/20 |
| | 6 | FIG.7 | Ni PLATED Cu-BASED | Sn/Cu/Invar Alloy/Cu/Sn=20 μm/33.3 μm/33.3 μm/33.3 μm/20 μm | 0/20 | 0/20 |
| | 7 | FIG.7 | Ni PLATED Cu-BASED | Sn-Ag/Cu/Invar Alloy/Cu/Sn-Ag=20 μm/33.3 μm/33.3 μm/33.3 μm/20 μm | 0/20 | 0/20 |
| | 8 | FIG.7 | Ni PLATED Cu-BASED | Sn-Cu/Cu/Invar Alloy/Cu/Sn-Cu=20 μm/33.3 μm/33.3 μm/33.3 μm/20 μm | 0/20 | 0/20 |
| | 9 | FIG.7 | Ni PLATED Cu-BASED | Sn-Ag/Cu/Al/Cu/Sn-Ag=20 μm/10 μm/100 μm/10 μm/20 μm | 0/20 | 0/20 |
| | 10 | FIG.7 | Ni PLATED 42 ALLOY-BASED | Sn-Ag/Cu/Invar Alloy/Cu/Sn-Ag=20 μm/33.3 μm/33.3 μm/33.3 μm/20 μm | 0/20 | 0/20 |
| | 11 | FIG.8 | Ni PLATED Cu-BASED | Sn/Cu/Invar Alloy/Cu/Sn=20 μm/33.3 μm/33.3 μm/33.3 μm/20 μm | 0/20 | 0/20 |
| | 12 | FIG.8 | Ni PLATED Cu-BASED | Sn-Ag/Cu/Invar Alloy/Cu/Sn-Ag=20 μm/33.3 μm/33.3 μm/33.3 μm/20 μm | 0/20 | 0/20 |
| | 13 | FIG.8 | Ni PLATED Cu-BASED | Sn-Cu/Cu/Invar Alloy/Cu/Sn-Cu=20 μm/33.3 μm/33.3 μm/33.3 μm/20 μm | 0/20 | 0/20 |
| | 14 | FIG.8 | Ni PLATED Cu-BASED | Sn-Ag/Cu/Al/Cu/Sn-Ag=20 μm/10 μm/100 μm/10 μm/20 μm | 0/20 | 0/20 |
| | 15 | FIG.8 | Ni PLATED 42 ALLOY-BASED | Sn-Ag/Cu/Invar Alloy/Cu/Sn-Ag=20 μm/33.3 μm/33.3 μm/33.3 μm/20 μm | 0/20 | 0/20 |

# SEMICONDUCTOR DEVICE AND METHOD FOR MANUFACTURING THEREOF

CROSS-REFERENCE TO RELATED APPLICATION

The present application claims priority from Japanese Patent Application No. JP 2005-311047 filed on Oct. 26, 2005, the content of which is hereby incorporated by reference into this application.

TECHNICAL FIELD OF THE INVENTION

The present invention relates to a technology for manufacturing a semiconductor device, in particular to a technology effective for applying to a semiconductor device such as a power semiconductor device having joints comprising a lead-free intermetallic compound layer which contains no lead and a stress-buffering layer.

BACKGROUND OF THE INVENTION

Figure 11:
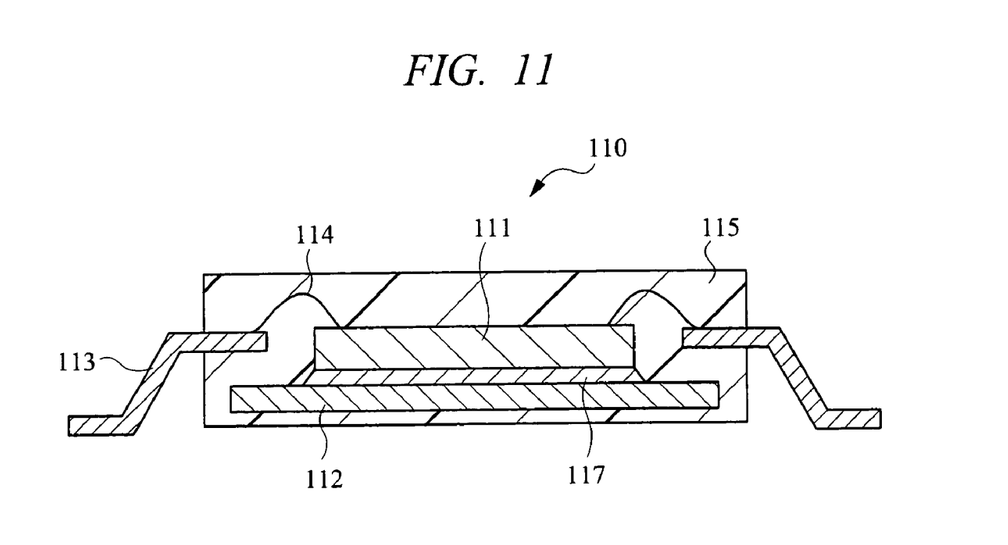
FIG. 11 is a cross-section view of the conventional power semiconductor device investigated as a premise of the present invention.

FIG. 11 shows an example of the structure of a conventional power semiconductor device investigated by the inventors of the present invention as a premise.

The conventional power semiconductor device 110 comprises a power semiconductor element 111 die-bonded on a frame 112 with a solder 117. After bonding the element to a lead 113 with a wire 114, the semiconductor device is molded with an epoxy-based resin 115. A high-lead solder or a solder containing a trace amount of Ag and Cu and having a melting point of 290° C. or higher is used as the solder 117 (the term melting point in the present invention refers to solidus temperature).

The maximum temperature sometimes reaches 280° C. in the wire-bonding process. In addition, the melting points of those Sn—Ag—Cu-based lead-free solders mainly used hereinafter are as high as about 220° C., and the semiconductor device is supposed to be heated at 260° C. in maximum for reflow bonding. Accordingly, a solder having a melting point of higher than 280° C., or the above-mentioned high-lead solder is used so that the solder 117 does not re-melt in the wire bonding process and reflow process.

Figure 12:
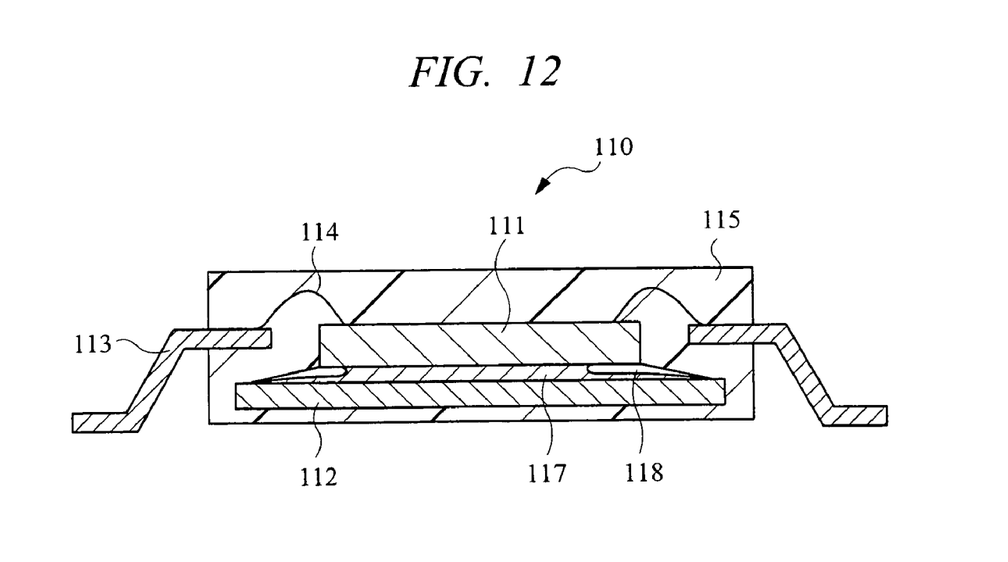
FIG. 12 is a cross-section view of generation of flush formed by a re-melt solder in the conventional power semiconductor as a reference of the present invention.

While the joint between the power semiconductor element 111 and frame 112 bonded with the solder 117 is molded with the epoxy-based resin 115, the solder 117 within the semiconductor device may leak out of the interface between the epoxy-based resin 115 and frame 112 due to cubical expansion by melting as shown in FIG. 12. This phenomenon is called flush. Or, even when the solder does not leak, it acts as if it wished to leak. Consequently, large voids 118 are formed within the solder after solidification to render the semiconductor device defective.

The significance of the solder 117 part at the joint is not only to fix the power semiconductor device 111 on the frame 112, but also functions to release the heat of the power semiconductor element 111 to the frame 112 side. Accordingly, when the voids 118 are formed by re-melting of the solder 117, heat dissipation through the joint becomes insufficient, and the function of the power semiconductor element 111 may be deteriorated.

In accordance with enforcement of the EU RoHS instruction (regulation of use of harmful substances used in electric and electronic appliances) on Jul. 1, 2006, developments of the lead-free solder for bonding a semiconductor element to a substrate has been rapidly progressed mainly on Sn—Ag—Cu-based lead-free solders.

On the other hand, die-bonding using the high-lead solder has been excluded out of the above-mentioned regulation because no technical solutions on the substitute of this lead-free solder have been invented. However, since the content of lead in this solder is as high as 90% or more, elimination of lead from the solder is desirable from the viewpoint of reduction in the environmental load.

However, reflow soldering to the substrate using the Sn—Ag—Cu-based lead-free solder is an inevitable step in the method for using the lead-free solder at the die-bonding joint. Accordingly, such lead-free solder should have a melting point of at least 260° C. or higher.

Sn—Sb-based solders (melting point: 232 to 240° C.) are examples of the Sn-based lead-free solders having a relatively high melting point. However, the melting point of these solders is yet so low that they cannot be used in the post process involving the re-melting process.

While Au—20Sn solder (melting point: 280° C.) is well known as lead-free high melting point solder, applications of this solder to cheap electronic parts are difficult when the cost is considered since the solder is expensive due to high content of Au of as much as 80%. Since this solder is a hard solder, the stress-buffering ability of this solder is insufficient for applying it to die-bonding that requires a relatively large bonding area. Therefore, the semiconductor element or joints thereof may be broken when the device is supposed to suffer from repeated thermal fatigue, and reliability of bonding may be impaired.

While the problem of reliability may be improved by increasing the amount of the supplied solder, this also causes another problem of profitability since the manufacturing cost further increases as the amount of supply of the solder increases.

Williams, W. et al. reported that the solder is able to have a high melting point by alloying the joint when the lead-free solder is used at the joint (Williams, W. et al., High Temperature Joints Manufactured at Low Temperature, Proceeding of ECTC., 1998; referred as non-patent document 1 hereinafter). The document reports that the joint is substantially converted into a $Cu_3Sn$ compound in order to permit the joint to have a high melting point by holding the joint for 16 hours after bonding GaAs metallized with Cr (0.03 μm)/Sn (2.5 μm)/Cu (0.1 μm) on the back surface to a substrate (a glass) metallized with Cr (0.03 μm)/Cu (4.4 μm)/Au (0.1 μm) at 280° C.

It is also reported that the joint can be made to have a high melting point by converting the joint into an Ag-rich alloy+$Ag_3In$ intermetallic compound by treating the joint at 150° C. for 24 hours, after bonding Si metallized with Cr (0.03 μm)/In (3.0 μm)/Ag (0.5 μm) on the back surface to Si metallized with Cr (0.03 μm)/Au (0.05 μm)/Ag (5.5 μm)/Au (0.05 μm) at 210° C.

Yamamoto et al. reported that all the joints are able to have high melting points by converting the joints into an intermetallic compound comprising $Ni_3Sn_4$, (Ni, Co)$Sn_2$+(Au, Ni, Co)$Sn_4$ by bonding Ni-xCO (X=0.10) metallized with Sn—3.5 Ag (26 μm) to Kovar metallized with Ni—20Co (5 μm), on which Au (1 μm) is further metallized, at 240° C., and by holding the joint for 30 minutes at that temperature (Yamamoto et al., Study on Intermetallic Compounds at Micro-Joint Using Sn—Ag Solder, Abstract of MES 2003, October, 2004, p45; referred as non-patent document 2 hereinafter). This means that using Ni—20Co containing Co for metallizing permits the growth rate of the compound to be enhanced.

When the joint has been once made to have a high melting point by the above mentioned method, the joint can be maintained without being re-melted even by heating at 260° C. in the reflow soldering process.

SUMMARY OF THE INVENTION

The inventors of the present invention considered that the high melting point technology described in non-patent documents 1 and 2 may be applied for using a lead-free solder at the die-bonding portion. However, the following problems were not considered in above-mentioned non-patent documents 1 and 2. Therefore, it was not easy to apply the technique to the die-bonding part that requires high reliability of the joint in order to permit the joint to exhibit an important function as a heat dissipation passageway of the semiconductor element.

The joint becomes rigid and fragile as compared with the joint of the currently used high-lead solder, since the joint is made to have a high melting point by forming intermetallic compounds in the bonding methods described in non-patent documents 1 and 2. However, both in the patent documents 1 and 2, the joint is made by combining the bonding materials having a small difference of thermal expansion coefficients to one another, nothing was considered on the break of the joint suffering from thermal fatigue due to fragility as a result of making the joint to have a high melting point.

When the above-mentioned methods are used for bonding in a combination of materials having a large difference of the thermal expansion coefficient such as a combination of a power semiconductor element (Si) and a Cu-based frame as an object of the present invention, heat stress at the joint caused by a temperature cycle cannot be buffered at the hard and fragile joint as shown in non-patent documents 1 and 2. Consequently, a chip suffers from large load and cracks are generated in the chip to make it impossible to ensure reliability of the joint.

While the thickness of the joint may be increased as an improving measure for preventing the cracks of the chip from being generated, the time required for completely forming the intermetallic compound becomes quite long when the thickness of the joint is large. While it is possible to shorten the time necessary for forming the complete intermetallic compound by raising the bonding temperature, stress generated by cooling after bonding becomes larger to cause the cracks of the chip.

Accordingly, it is impossible today to satisfy required specifications of reliability of bonding at the joint by using the high melting point techniques described in non-patent documents 1 and 2. The lead-free solder technique cannot be applied to the die-bonding part unless the problem of reliability of the joint is solved.

The present invention provides a semiconductor device capable of lead-free bonding with reliability of the joint, wherein the joint between bonding materials having a large difference of thermal expansion coefficients to one another such as a semiconductor element (Si) and a Cu-based frame can be maintained even at the highest temperature supposed to arise at a reflow process, and the semiconductor element is not broken by thermal stress applied to the joint.

More particularly, the present invention provides a semiconductor device comprising a lead-free joint capable of obtaining good reliability of the joint even in die-bonding that requires a relatively large bonding area, wherein the joint is maintained at 260° C. in the reflow process with a combination of materials having a large difference of thermal expansion coefficients to one another such as a combination of a semiconductor element (Si) and a Cu-based frame.

These and other objects, features and advantages of the invention will be apparent from the following more particular description of preferred embodiments of the invention, as illustrated in the accompanying drawings.

The typical ones of the inventions disclosed in this application will be briefly described as follows.

(1) The present invention provides a semiconductor device having a joint between a semiconductor element and a flame plated with Ni on the surface thereof, comprising, from the semiconductor element side: an intermetallic compound layer having a melting point of 260° C. or higher; a Cu layer; a metal layer having a melting point of 260° C. or higher; a Cu layer; and an intermetallic compound layer having a melting point of 260° C. or higher.

(2) The present invention provides the semiconductor device according to (1), wherein the intermetallic compound layer having a melting point of 260° C. or higher is formed by mainly allowing the Cu layer to react with at least one of Sn, Sn—Cu-based, Sn—Ag-based, Sn—Ag—Cu-based, In, In—Sn-based, In—Ag-based, and In—Cu-based lead-free solders having a melting point of 260° C. or lower.

(3) The present invention provides the semiconductor device according to (1), wherein the metal layer having a melting point of 260° C. or higher comprises at least one of an Invar alloy, a Cu—Mo alloy, Ti, Mo, and W.

(4) The present invention provides the semiconductor device according to (1), wherein the metal layer having a melting point of 260° C. or higher comprises at least one of Al, Mg, Ag, Zn, and Cu.

(5) The present invention provides a method for manufacturing a semiconductor device comprising the steps of: bonding a semiconductor element and a frame plated with Ni on the surface thereof using a composite foil comprising a Cu layer on the two sides of a metal layer having a melting point of 260° C. or higher and a lead-free solder layer having a melting point of 260° C. or lower formed on the Cu layer; mainly allowing the Cu layer to react with the lead-free solder layer by heating; and forming an intermetallic compound having a melting point of 260° C. or higher in order to render the joint non-meltable at 260° C.

(6) The present invention provides the method for manufacturing a semiconductor device according to (5), wherein the intermetallic compound layer having a melting point of 260° C. or lower is at least one of Sn, Sn—Cu-based, Sn—Ag-based, Sn—Ag—Cu-based, In, In—Sn-based, In—Ag-based, and In—Cu-based lead-free solders.

(7) The present invention provides the method for manufacturing a semiconductor device according to (5), wherein the metal layer having a melting point of 260° C. or higher comprises at least one of an Invar alloy, a Cu—Mo alloy, Ti, Mo, and W.

(8) The present invention provides the method for manufacturing a semiconductor device according to (5), wherein the metal layer having a melting point of 260° C. or higher comprises at least one of Al, Mg, Ag, Zn, and Cu.

(9) The present invention provides the method for manufacturing a semiconductor device according to (5), wherein the intermetallic compound is formed in an $N_2$ atmosphere.

(10) The present invention provides the method for manufacturing a semiconductor device according to (5), wherein the intermetallic compound is formed in an $N_2+H_2$ atmosphere.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

The embodiment of the present invention will be described in detail hereinafter.

Concept of the Embodiment

A semiconductor device of the embodiment according to the present invention has a joint between a semiconductor element and a frame plated with Ni on the surface, and the joint comprises, from the semiconductor element side, an intermetallic compound layer having a melting point of 260° C. or higher, a Cu layer, a metal layer having a melting point of 260° C. or higher, a Cu layer and an intermetallic compound layer having a melting point of 260° C. or higher.

The intermetallic compound is usually rigid but fragile. Accordingly, a metal layer having a stress-buffering effect is inserted in the layers of the joint in order to prevent cracks from being generated between the semiconductor element and intermetallic compound by buffering the stress generated in the joint by a temperature cycle and cooling after bonding. Consequently, the joint becomes highly reliable in any of the joints between materials having a large difference of the thermal expansion coefficient to one another such as the joint between the semiconductor element and a Cu-based frame, and between materials having a small difference of the thermal expansion coefficient to one another such as the joint between the semiconductor element and 42 Alloy-based frame.

Figure 1A:
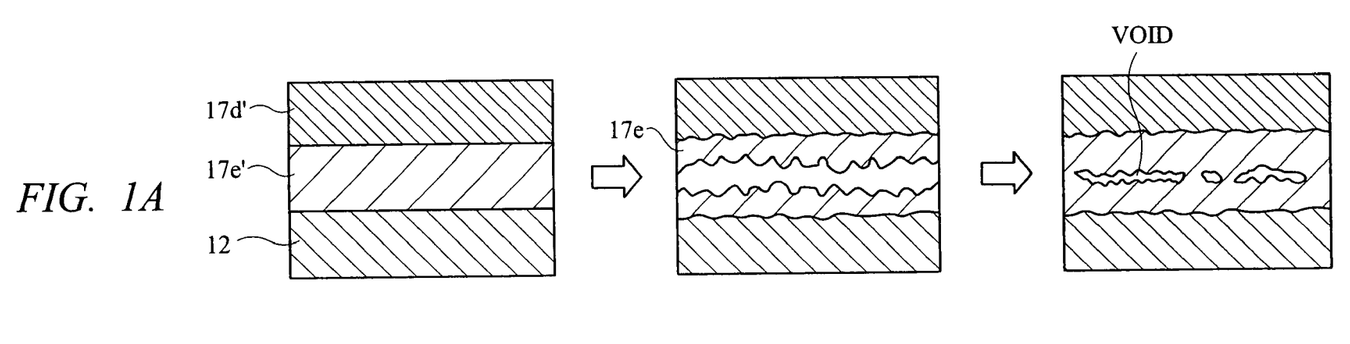
FIG. 1A shows a void-forming mechanism at the joint in the conventional art.
Figure 1B:
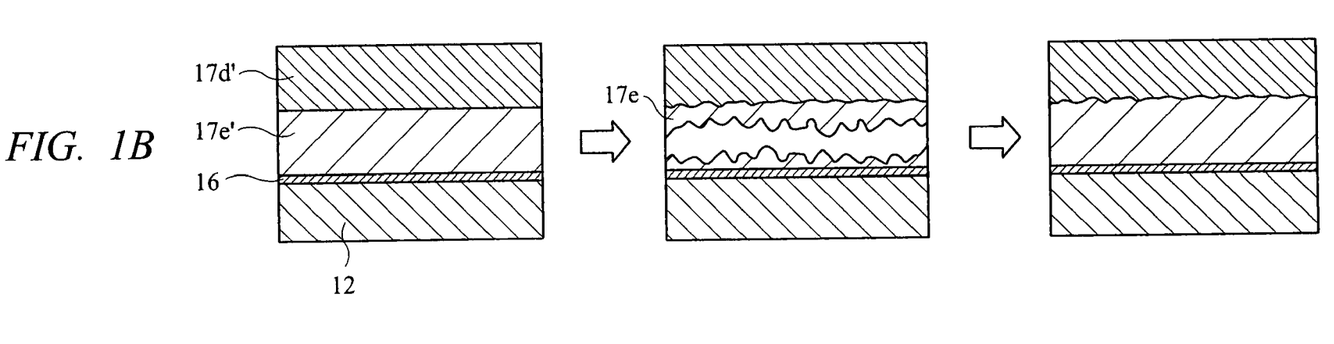
FIG. 1B shows a void-forming mechanism at the joint in an embodiment of the present invention.

The intermetallic compound constituting the joint is formed by allowing a lead-free solder having a melting point of 260° C. or lower to react mainly with a Cu layer. In this process, the volumes of the Cu layer and lead-free solder layer change when the intermetallic compound is formed. The lead-free solder layer reacts with the Cu layer and the frame when a solid Cu frame is used as a bonding material. As a result, voids are readily formed due to volume changes at two positions in the interfaces between the lead-free solder layer 17e' and Cu layer 17d' and between the lead-free solder layer 17e' and frame 12 as shown in FIG. 1A (conventional art). On the other hand, when an Ni plating layer 16 is provided on the frame 12 as shown in FIG. 1B (the embodiment of the present invention), an intermetallic compound layer 17e formed by a reaction between the Cu layer 17d' and lead-free solder layer 17e' is formed on the Ni plating layer 16 without any substantial loss of the Ni plating layer 16. Consequently, voids are hardly formed since the volume changes only at the interface between the lead-free solder layer 17e' and Cu layer 17d'. FIG. 1B corresponds to the first embodiment described below.

More over, in the semiconductor device of the embodiment, the intermetallic compound layer having a melting point of 260° C. or higher is formed by allowing at least one of Sn, Sn—Cu-based, Sn—Ag-based, Sn—Ag—Cu-based, In, In—Sn-based, In—Ag-based and In—Cu-based lead-free solders to react mainly with the Cu layer.

Bonding should be performed at 400° C. in die-bonding process, since the Cu-based frame is softened by bonding at a temperature of 400° C. or higher. The Sn, Sn—Cu, Sn—Ag, Sn—Ag—Cu, In, In—Sn, In—Ag and In—Cu-based lead-free solders have a melting point of 260° C. or lower. Accordingly, the joint cannot be maintained when any one of these lead free solders is used alone due to flush and peeling at the interface of the joint because the solder re-melts by heating in a secondary mounting step. Therefore, an intermetallic compound having a melting point of 260° C. or higher should be formed by allowing aforesaid lead-free solder layer to react with the Cu layer. The thickness of the intermetallic compound at the joint is preferable in the range of 1 to 30 µm. When the thickness is 1 µm or smaller, defective joints may be formed since the entire interface cannot be reliably wetted for bonding. When the thickness is 30 µm or larger, on the other hand, a long period of time is necessary for converting the joint into a complete intermetallic compound, and productivity may be impaired. Since bonding is possible at the melting point of the lead-free solder or higher in this method, the stress generated by cooling can be reduced by decreasing the temperatures for bonding and for forming the intermetallic compound.

The metal layer having a melting point of 260° C. or higher comprises at least one of Invar alloy, Cu—Mo alloy, Ti, Mo, and W in the semiconductor device according to the embodiment.

The Inver alloy, Cu—Mo alloy, Ti, Mo, and W are able to buffer the stress generated by the temperature cycle and cooling after bonding, since the metals have thermal expansion coefficients within the range between those of the semiconductor element and Cu-based frame. The thickness of the metal layer is preferably 30 μm or more. The stress cannot be sufficiently buffered when the thickness is smaller than 30 μm, and cracks may occur in the semiconductor element and intermetallic compound.

Alternatively, the metal layer having a melting point of 260° C. or higher comprises at least one of Al, Mg, Ag, Zn and Cu in the semiconductor device according to the embodiment.

Figure 2:
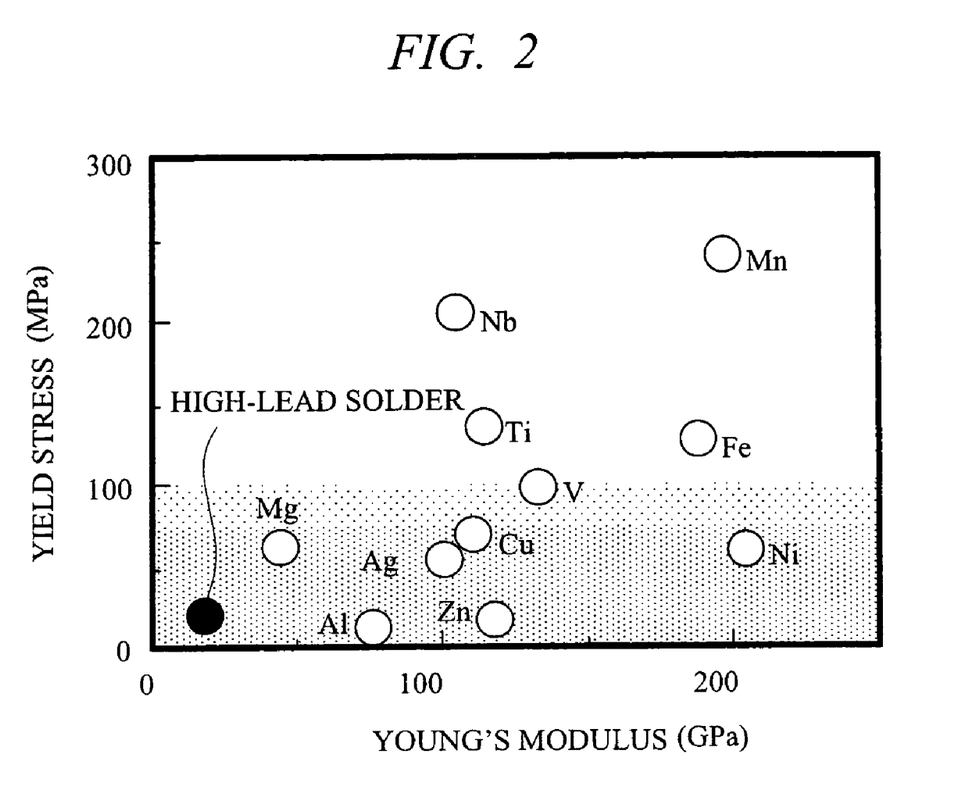
FIG. 2 shows the relationship between the Young's modulus and yield stress of various materials available as the stress-buffering layer in the embodiment of the present invention.

Al, Mg, Ag, Zn, and Cu are metals each having a small yield stress, and is readily subjected to plastic deformation as compared with the intermetallic compound. Accordingly, the stress generated by the temperature cycle and cooling after bonding may be buffered by inserting one of these metals in the joint. The yield stress is preferably 75 MPa or less as shown in FIG. 2. The stress cannot be sufficiently buffered when the yield stress is 100 MPa or more, and the semiconductor element may be cracked. The thickness of the metal layer is preferably in the range of 30 to 200 μm. The stress cannot be sufficiently buffered when the thickness is 30 μm or smaller, and cracks may occur in the semiconductor element and intermetallic compound. The effect of the thermal expansion coefficient increases when the thickness of the metal layer is 200 μm or larger, since Al, Mg, Ag, and Zn each has a larger thermal expansion coefficient than that of the Cu-based frame, and reliability of the semiconductor device may be impaired.

The method for manufacturing the semiconductor device of the embodiment according to the present invention comprises the steps of: bonding the semiconductor element to the frame plated with Ni on the surface using a composite foil comprising Cu layers on both surfaces of a metal layer having a melting point of 260° C. or higher and a lead-free solder layer with a melting point of 260° C. or lower provided on the Cu layers; and additionally allowing mainly the Cu layer to react with the lead-free solder layer by heating to form an intermetallic compound having a melting point of 260° C. or higher to render the joint non-meltable at 260° C.

Bonding cannot be maintained due to flush and peeling at the interface of the joint because the solder re-melts by heating in a secondary mounting step when any one of these lead-free solders having a melting point of 260° C. or lower is used alone. Accordingly, an intermetallic compound having a melting point of 260° C. or higher should be formed by allowing the lead-free solder layer to react with the Cu layer provided on the composite foil. However, the intermetallic compound is generally rigid and fragile. Therefore, cracks in the semiconductor element and intermetallic compound are prevented from occurring by inserting a metal layer having a stress-buffering effect in order to buffer the stress generated in the joint by the temperature cycle and cooling after bonding.

The semiconductor device according to each embodiment will be described in detail hereinafter with reference to drawings based on the above-described concept of the embodiment. Power semiconductor devices with various package structures will be described as examples of the semiconductor device in each embodiment. However, the present invention is not limited to the power semiconductor device, and is applicable to various semiconductor devices.

First Embodiment: Examples 1 to 5

Figure 3:
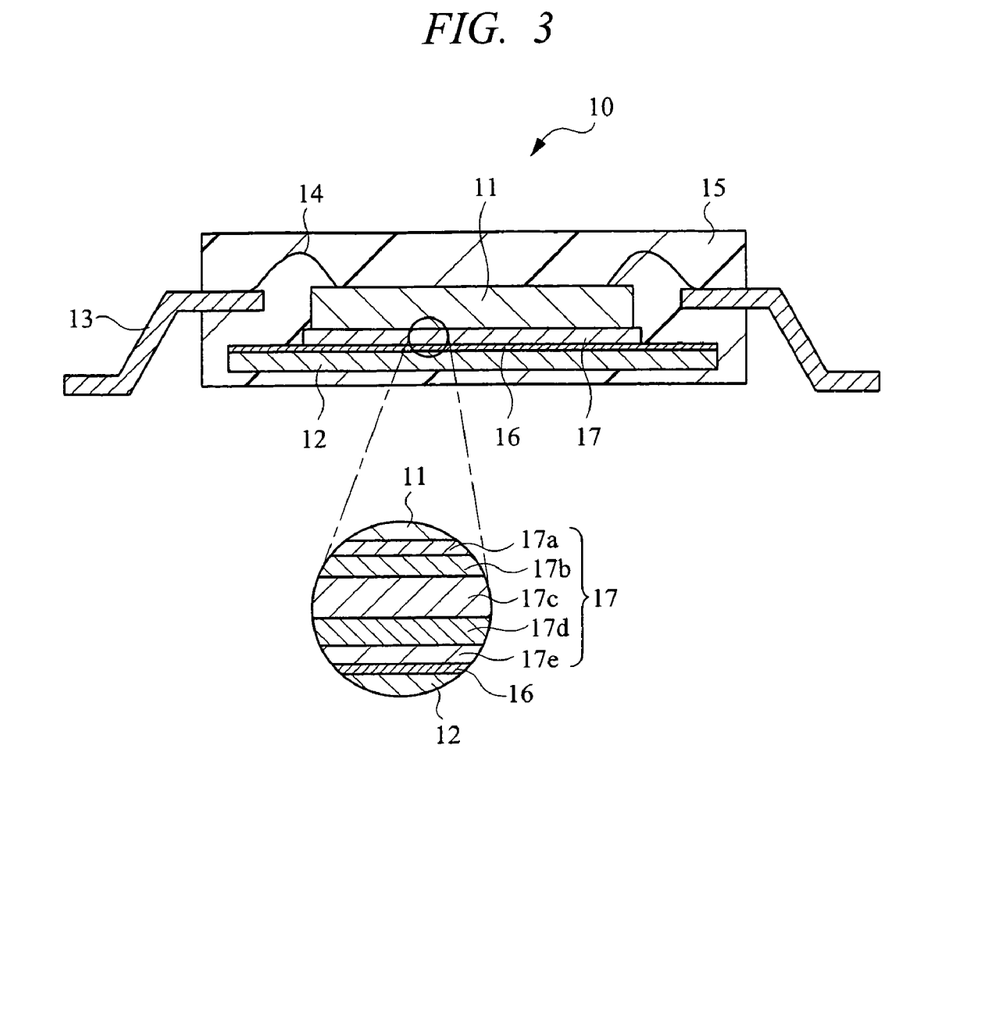
FIG. 3 is a cross-section view showing the power semiconductor device according to a first embodiment of the present invention.

FIG. 3 shows a cross-section view of a power semiconductor device according to a first embodiment.

The semiconductor device 10 according to the first embodiment comprises a power semiconductor element 11, a frame 12 to which the power semiconductor element 11 is bonded, a lead 13 as an external terminal, a wire 14 for wire bonding between the electrode of the semiconductor element 11 and an inner lead of the lead 13, and an epoxy-based resin 15 for molding the semiconductor device with the resin with exposure of a portion that serves as an external terminal of the lead 13. The frame 12 has an Ni plating layer 16 on the surface thereof.

A joint 17 between the power semiconductor element 11 and the frame 12 having the Ni plating layer 16 is composed of a laminated structure comprising, from the power semiconductor element 11 side, an intermetallic compound layer 17e having a melting point of 260° C. or higher, a Cu layer 17b, a metal layer 17c having a melting point of 260° C. or higher, a Cu layer 17d, and an intermetallic compound layer 17e having a melting point of 260° C. or higher.

The power semiconductor device according to the first embodiment is manufactured by the following process.

Figure 4:
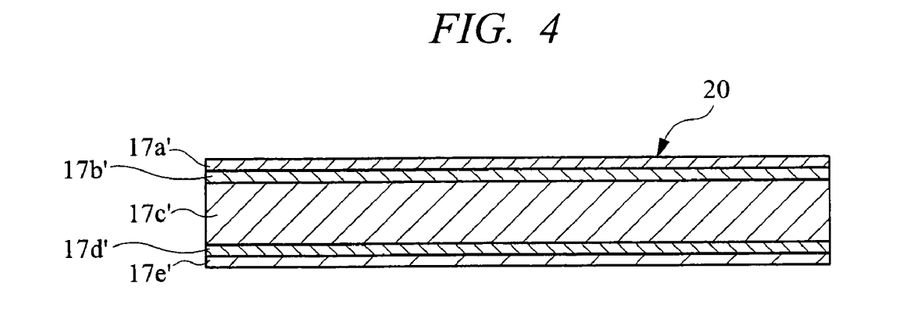
FIG. 4 is a cross-section view showing the construction of the composite foil according to the first embodiment of the present invention.

A composite foil 20 having the construction as shown in FIG. 4 is prepared for forming the joint in the manufacturing of the power semiconductor device 10. The composite foil 20 corresponds to the joint 17 in FIG. 3, and as shown in FIG. 4, comprises a metal layer 17c' having a melting point of 260° C. or higher, Cu layers 17b' and 17d' provided on the surface and back surface of the metal layer 17c' respectively, and lead-free solder layers 17a' and 17e' provided on the surfaces of the Cu layers 17b' and 17d' respectively (the solder layers react with the Cu layers 17b' and 17d' to form intermetallic compound layers 17a and 17e, respectively).

Firstly, the power semiconductor element 11 is subjected to die bonding on the Cu-based frame 12 (also applicable to a 42 alloy-based frame) with interposition of the composite foil 20. Specifically, the composite foil 20 for forming the joint is placed on a die pad of the Cu-based frame 12 having the Ni plating layer 16, and the frame is bonded to the power semiconductor element 11 while the element is placed on the composite foil 20. The atmosphere for bonding may be any one of $N_2$, $H_2$ and $N_2+H_2$. The size of the power semiconductor element 11 used was 5 mm×5 mm with a back surface electrode of Ti/Ni/Ag.

Then, the intermetallic compound layers 17a' and 17e' are formed by allowing the lead-free solder layers 17a' and 17e' to react with the Cu layers 17b' and 17d', respectively, by heating at 300° C. for 60 minutes in $N_2$ atmosphere in order to render the joint 17 completely non-meltable at 260° C. $N_2$ is provided so that the power semiconductor element 11 does not react with the lead-free solder layer 17a'. While the reaction takes place in the $H_2$ atmosphere as a substitute of the $N_2$ atmosphere, no reaction occurs between the semiconductor element and solder layer in the $N_2+H_2$ atmosphere in which about 4 to 15% of $H_2$ is mixed. Since the intermetallic compound can be formed without allowing the semiconductor element to react with the solder layer, such mixed gas system may be also used as a substitute of $N_2$ gas.

Figure 5:
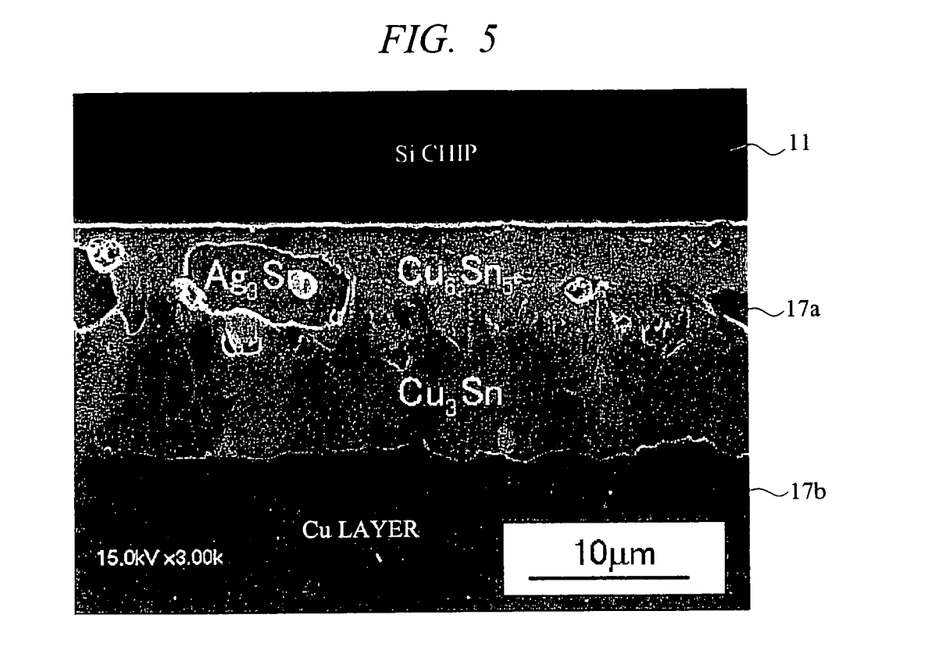
FIG. 5 shows a photograph of the cross-section view of the joint between a power semiconductor element and an intermetallic compound layer according to the first embodiment of the present invention.

The photograph of the cross-section view at the joint between the power semiconductor 11 and intermetallic compound layer 17a after forming the intermetallic compound is shown in FIG. 5. It is possible to confirm from FIG. 5 that the joint comprises an intermetallic compound layer 17a mainly consisting a Cu—Sn compound between the Cu layer 17b' and lead-free solder layer 17a', when a laminate of Sn—Ag (lead-free solder layer 17a')/Cu (Cu layer 17b')/Invar alloy (metal layer 17c')/Cu (Cu layer 17d')/Sn—Ag (lead-free solder layer 17e') is used as the composite foil.

Figure 9:
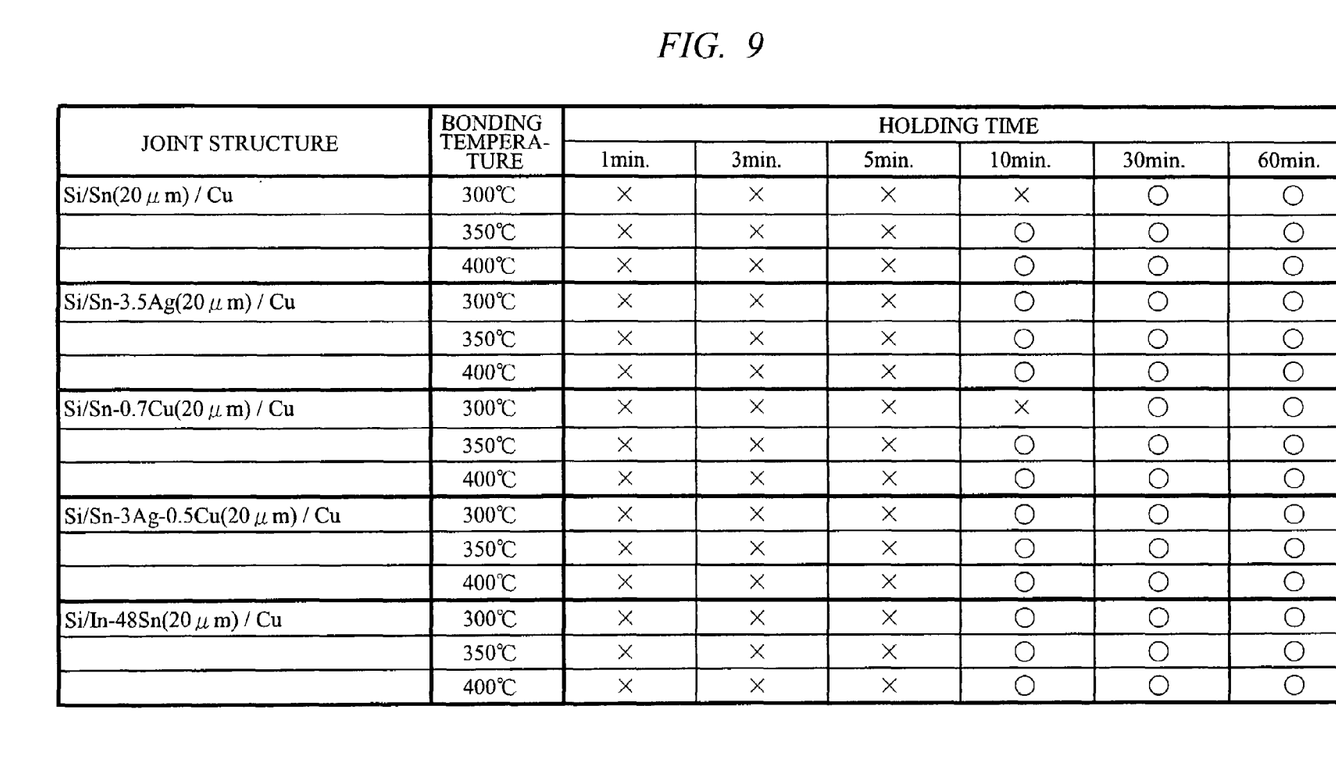
FIG. 9 shows the results of experiments for forming complete intermetallic compounds at the joint when Si is bonded to Cu using various lead-free solders under various conditions in the embodiment of the present invention.

The results of experiments when the joint was completely converted into an intermetallic compound are shown in FIG. 9, wherein Si (power semiconductor element 11) and Cu (frame 12) is bonded under various conditions using various lead-free solders. Sn, Sn-3.5Ag, Sn-0.7Cu, Sn-3Ag-0.5Cu, and In-48Sn were used as the solders for the joint structure of Si/solder/Cu. The bonding temperature was 300° C., 350° C. or 400° C., and the holding time was 1, 3, 5, 10, 30 or 60 minutes. As shown in FIG. 9, from the results of experiments when the semiconductor element was bonded to the frame with the joint structure of Si/solder/Cu at various temperatures and holding times, the joint was converted into a complete intermetallic compound (marked with "O") at a heating temperature of 300° C. or higher and a holding time of 30 minutes or more.

The electrode formed on the surface of the power semiconductor element 11 is bonded to the inner lead of the lead 13 using an Au or Al wire 14 thereafter. Then, the power semiconductor element 11, frame 12, wire 14 and joint 17 are sealed using the epoxy-based resin 15. The power semiconductor device 10 is manufactured by the above-described process.

Figure 6A:
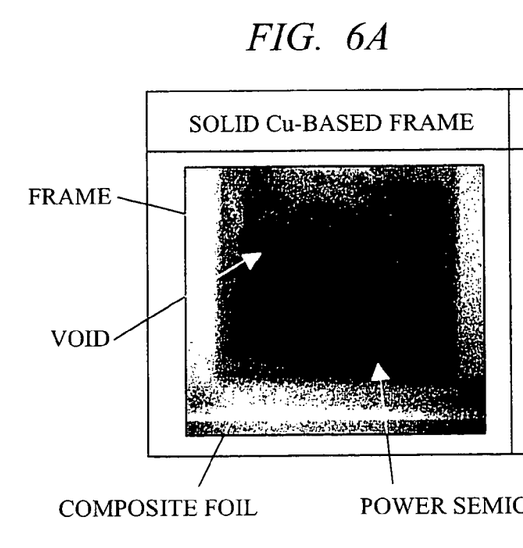
FIG. 6A shows formation of the void when the semiconductor element is bonded using a solid Cu-based frame in the conventional art according to the first embodiment of the present invention.
Figure 6B:
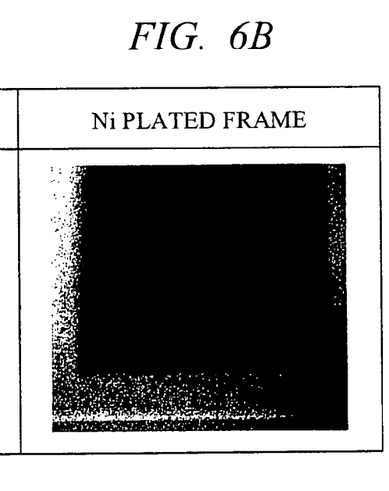
FIG. 6B shows formation of the void when the semiconductor element is bonded using a Ni plated Cu-based frame of the present embodiment according to the first embodiment of the present invention.

Generation of voids in the power semiconductor device manufactured as described above is shown in FIG. 6, wherein the semiconductor element is bonded using a solid Cu-based frame (conventional art) or a Ni-plated Cu-based frame (embodiment of the present invention). As shown in FIG. 6, in the case where the solid Cu-based frame (a) and Ni-plated Cu-based frame (b) were used, many voids are observed in the X-ray transmission image when the solid Cu-based frame was used (FIG. 6A), while substantially no void is observed in the X-ray transmission image when the Ni-plated Cu-based frame was used (FIG. 6B). These results show that plating the bonding material with Ni permits the number of voids to be significantly reduced.

Figure 10:
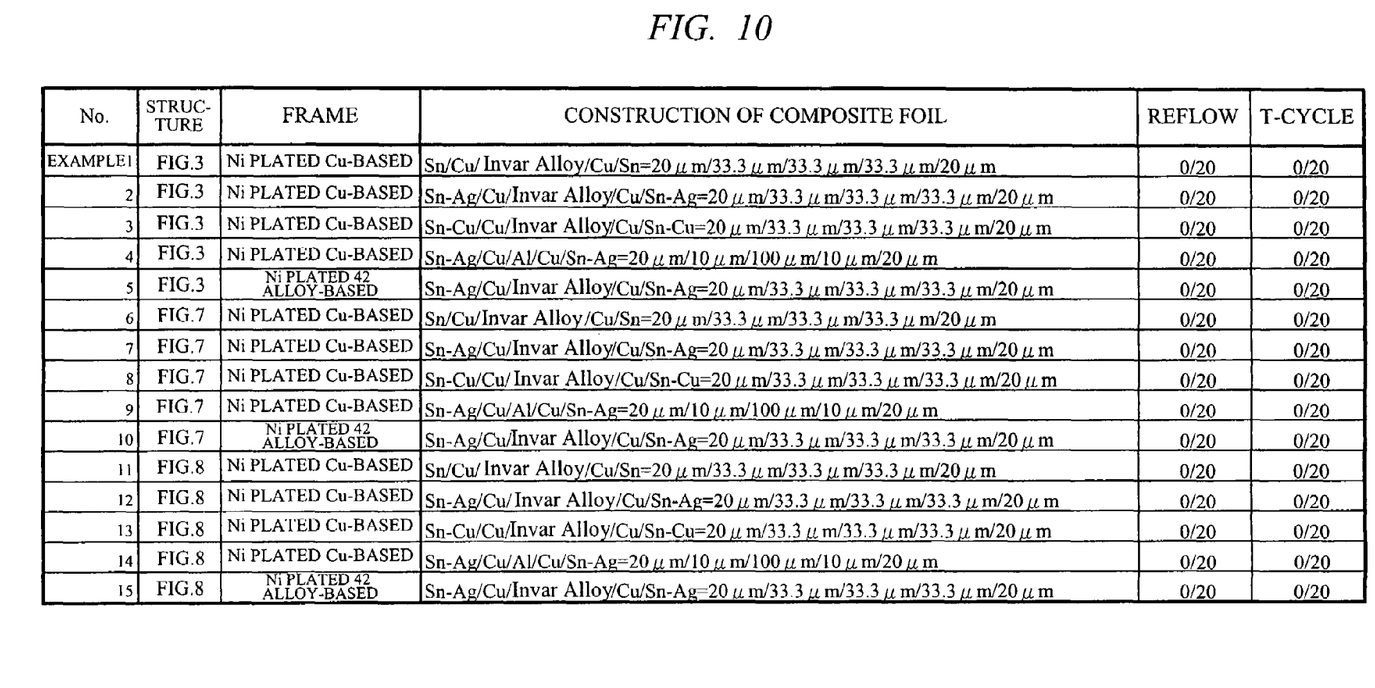
FIG. 10 shows the incidence of defects induced by the reflow test and temperature cycle test when various power semiconductor devices are bonded using various composite foils in the embodiment of the present invention.

The power semiconductor device 10 manufactured was subjected to a reflow test and temperature cycle test after allowing the device to absorb moisture. FIG. 10 shows the incidence of defective products by the reflow test and temperature (T) cycle test when various power semiconductor devices were bonded to the frame using various composite foils. Twenty samples were tested in each example, wherein the Ni-plated Cu-based frame was used in Examples 1 to 4 while the Ni-plated 42 Alloy-based frame was used in Example 5. The composite foils used in respective examples were Sn/Cu/Invar alloy/Cu/Sn, Sn—Ag/Cu/Invar alloy/Cu/Sn—Ag, Sn—Cu/Cu/Invar alloy/Cu/Sn—Cu, Sn—Ag/Cu/Al/Cu/Sn—Ag foils.

The maximum temperature for the reflow test was 260° C., and the ability for holding the joint was confirmed. The results showed that no flush, peeling and chip crack were observed in all Examples 1 to 5 (zero case). Then, 500 cycles (1 cycle:–55° C. (30 minutes)/150° C. (30 minutes)) of the temperature cycle test was performed after the reflow test. The results showed that no chip crack was generated in all Examples 1 to 5 (zero case). An observation of the cross-section view of the joint showed that no crack was generated in Si (power semiconductor 11) and intermetallic compound (zero case).

The above results show that, in the power semiconductor device 10 according to the first embodiment, the number of voids at the joint 17 may be significantly reduced by using the frame 12 having the Ni plate layer 16, and the laminated structure of the joints 17 can assure sufficient reliability for the reflow process and temperature cycle.

Second Embodiment: Examples 6 to 10

Figure 7:
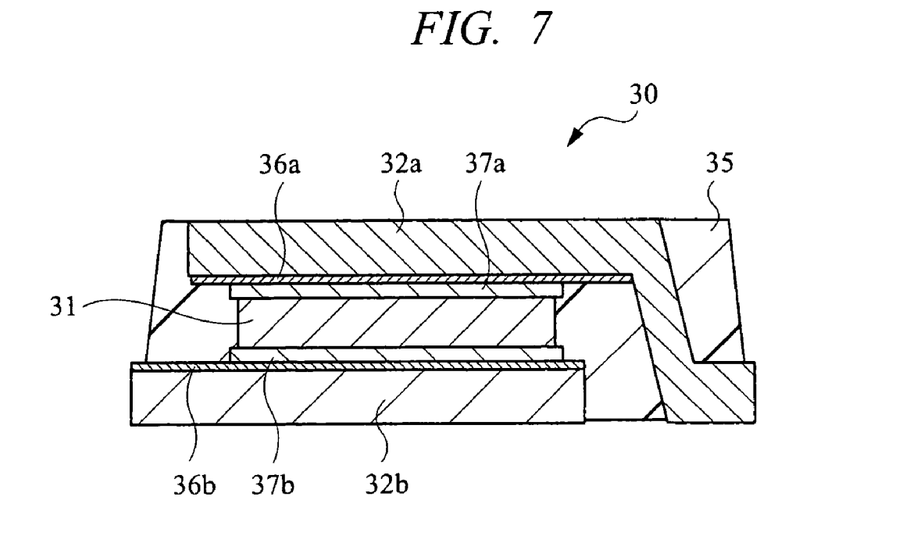
FIG. 7 is a cross-section view of the power semiconductor device according to a second embodiment of the present invention.

FIG. 7 shows a cross-section view of a power semiconductor element according to a second embodiment of the present invention.

The power semiconductor device 30 according to the second embodiment of the present invention comprises a power semiconductor element 31, a drain frame 32a and a source-gate frame 32b to which the power semiconductor element 31 is bonded, and an epoxy-based resin 35 for molding the semiconductor device with the resin with exposure of the portions to serve as external terminals of the drain frame 32a and source-gate frame 32b. The surfaces of the drain frame 32a and source-gate frame 32b comprise Ni plated layers 36a and 36b, respectively.

In the power semiconductor device 30, joints 37a and 37b between the power semiconductor element 31 and drain frame 32a, and between the power semiconductor element 31 and the source-gate frame 32b, respectively, are composed of laminated structures each comprising, from the power semiconductor element side as in the first embodiment, an intermetallic compound layer having a melting point of 260° C. or higher, a Cu layer, a metal layer having a melting point of 260° C. or higher, and an intermetallic compound layer having a melting point of 260° C. or higher.

The power semiconductor device 30 according to the second embodiment of the present invention is manufactured, for example, by the manufacturing process shown below.

This manufacturing process for the power semiconductor device 30 comprises the steps of: placing the composite foil for manufacturing the joint as shown in FIG. 4 on a Cu-based drain frame 32a having the Ni plating layer 36a; and further bonding the power semiconductor element 31 on the composite foil so that the element is placed with the drain side downward. The semiconductor element 31 has a size of 5 mm×5 mm, and the back surface electrode of the element comprises a laminate of Ti/Ni/Ag.

Then, similar composite foil is placed on the source-gate side of the power semiconductor element 31, and the foil is bonded to the element with the Cu-based source-gate frame 32b having the Ni plating layer 36b thereon is placed on the element. The drain frame 32a, source-gate frame 32b, power semiconductor element 31 and composite foils may be laminated all together in order to bond them by one time of heating.

The joints 37 (37a and 37b) are completely made to be non-meltable at 260° C. by forming an intermetallic compound by allowing the lead-free solder layer to react with the Cu layer by heating at 300° C. for 60 minutes with pressurizing in $N_2$ atmosphere as in the first embodiment of the present invention.

The power semiconductor element 31, drain frame 32a and source-gate frame 32b (except the portions that serve as the external terminals), and joints 37a and 37b are sealed using the epoxy-based resin 35. The power semiconductor device 30 is manufactured by the above-described process.

The power semiconductor device 30 thus manufactured was subjected to a reflow test at a maximum temperature of 260° C. in order to confirm hold of the joints. The results are shown in FIG. 10. No flush, peeling and chip crack were generated in all Examples 6 to 10. The samples were also subjected to 500 cycles (one cycle:−55° C. (30 minutes)/150° C. (30 minutes)) of the temperature cycle test. The results are shown in FIG. 10. No chip crack was generated in all Examples 6 to 10. An observation of the cross-section view of the joint showed no crack in both Si (power semiconductor element 31) and intermetallic compound.

According to the above-described power semiconductor device 30 of the second embodiment of the present invention, incidence of voids in the joints 37a and 37b could be significantly reduced by using the drain frame 32a and source-gate frame 32b having the Ni plating layers 36a and 36b, respectively, while sufficient reliability can be assured for the reflow test and temperature cycle test due to the laminated structure of the joints 37a and 37b.

Third Embodiment: Examples 11 to 15

Figure 8:
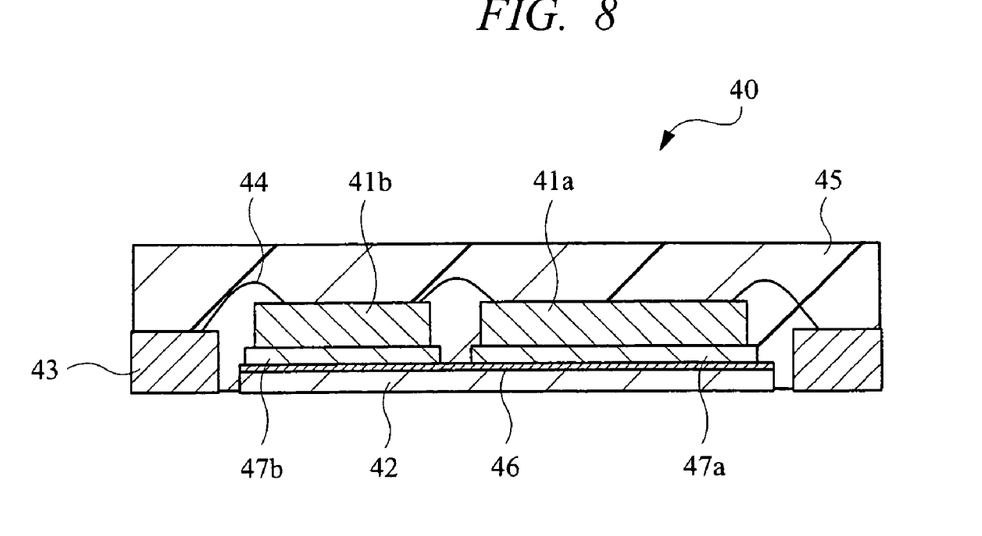
FIG. 8 is a cross-section view of the power semiconductor device according to a third embodiment of the present invention.

FIG. 8 shows a cross-section view of a power semiconductor device according to a third embodiment.

The power semiconductor device 40 according to the third embodiment of the present invention comprises power semiconductor elements 41a and 41b, a frame 42 to which the power semiconductor elements 41a and 41b are bonded, a terminal 43 that serves as an external terminal, wires 44 for wire bonding between respective electrodes of the power semiconductor elements 41a and 41b, and an epoxy-based resin 45 for molding the semiconductor device with the resin leaving the portions serving as the external terminals exposed. The frame 42 is plated by the Ni plating 46.

In the power semiconductor device 40, the joints 47a and 47b between the power semiconductor elements 41a and 41b and the frame 42 respectively, are composed of laminated structures comprising, from the power semiconductor elements 41a and 41b side, intermetallic compound layers having a melting point of 260° C. or higher, Cu layers, metal layers having a melting point of 260° C. or higher, Cu layers, and intermetallic compound layers having a melting point of 260° C. or higher.

The power semiconductor device according to the third embodiment of the present invention is manufactured, for example, by the following manufacturing process.

The power semiconductor device 40 comprises a plurality of power semiconductor elements 41a and 41b bonded on the frame 42 by die bonding with interposition of composite foils, wherein the manufacturing process comprises the steps of placing the composite foils for forming the junctions on die pads of the Cu-based frame 42 having a Ni plating layer 46 as in FIG. 6, and further bonding the semiconductor elements to the frame while the power semiconductor elements 41a and 41b are placed on the composite foils. Each back surface electrode of the power semiconductor elements 41a and 41b used is composed of a laminate of Ti/Ni/Ag.

Next, the junctions 47a and 47b are completely made to be non-meltable at 260° C. as in the first embodiment by heating at 300° C. for 60 minutes in $N_2$ atmosphere with pressurizing in order to allow the lead-free solder layer to react with the Cu layer to form an intermetallic compound.

After that, the electrodes formed on the surface of the power semiconductor elements 41a and 41b, or the electrode and the terminal 43 are bonded using an Au or Al wire 44. Subsequently, the power semiconductor elements 41a and 41b, the frame 42 (except the back surface), the terminal 43 (except the portion that serves as an external terminal), the wire 44 and joints 47a and 47b are sealed by using epoxy-based resin 45. The power semiconductor device 40 is manufactured by the above-described process.

The power semiconductor device 40 thus manufactured was subjected to a reflow test at a maximum temperature of 260° C. after allowing the device to absorb moisture as in the first embodiment, in order to confirm bond-holding ability. The results are shown in FIG. 10. No flush, peeling and chip cracks were generated in all Examples 11 to 15. The semiconductor device was further subjected to 500 cycles of the temperature cycle test (one cycle: −55° C. (30 minutes)/150° C. (30 minutes)). The results are shown in FIG. 10. No chip crack occurred in all Examples 11 to 15. An observation of the cross-section view of the joint showed no generation of cracks in both Si (power semiconductor element 41a and 41b) and intermetallic compound.

According to the above-described power semiconductor device 40 according to the third embodiment of the present invention, the number of voids in the joints 47a and 47b could be significantly reduced by using the frame 42 having the Ni plating layer 46, while the laminated structure of the joints 47a and 47b permit sufficient reliability assured for the temperature cycle test.

In the foregoing, the invention made by the inventors of the present invention has been concretely described based on the embodiments. However, it is needless to say that the present invention is not limited to the foregoing embodiments and various modifications and alterations can be made within the scope of the present invention.

The effects obtained by typical aspects of the present invention will be briefly described below.

According to the present invention, the semiconductor element can be bonded to the frame with substantially no generation of voids. Accordingly, the present invention can provide a lead-free semiconductor device having high reliability of the joint for reflow soldering and temperature cycle at a maximum temperature of 260° C. on the substrate even when the difference of the thermal expansion coefficients between the bonding materials is large.

By this means, according to the present invention, no chip crack occurs due to the stress caused in the temperature cycle. The present invention enables lead-free die-banding without suffering from melting in the reflow process.

The invention may be embodied in other specific forms without departing from the spirit or essential characteristics thereof. The present embodiment is therefore to be considered in all aspects as illustrative and not restrictive, the scope of the invention being indicated by the appended claims rather than by the foregoing description and all changes which come within the meaning and range of equivalency of the claims are therefore intended to e embraced therein.

What is claimed is:

1. A semiconductor device having a semiconductor element and a frame to which the semiconductor element is bonded, wherein said frame is plated with Ni on the surface thereof, and a joint between the semiconductor element and the frame includes, from the semiconductor element side, a laminated structure comprising: a first intermetallic compound layer having a melting point of 260° C or higher; a first Cu layer; a metal layer having a melting point of 260° C. or higher; a second Cu layer; and a second intermetallic compound layer having a melting point of 260° C. or higher.

2. The semiconductor device having a semiconductor element and a frame to which the semiconductor element is bonded,
wherein said frame is plated with Ni on the surface thereof, and
a joint between the semiconductor element and the frame includes, from the semiconductor element side, a laminated structure comprising: a first intermetallic compound layer having a melting point of 260° C. or higher; a first Cu layer: a metal layer having a melting point of 260° C. or higher; a second Cu layer; and a second intermetallic compound layer having a melting point of 260° C. or higher, and
wherein the first intermetallic compound layer or the second intermetallic compound layer is formed by allowing at least one of Sn, Sn-Cu-based, Sn-Ag-based, Sn-Ag-Cu-based, In, In-Sn-based, In-Ag-based, and In-Cu-based lead-free solders having a melting point of 260° C. or lower to react with the first Cu layer or second Cu layer to form a complete first or second intermetallic compound layer having a higher melting point than a melting point of said at least one solder.

3. The semiconductor device according to claim 1, the metal layer comprises at least one of Invar alloy, a Cu-Mo alloy, Ti, Mo, and W.

4. The semiconductor device according to claim 1, wherein the metal layer comprises at least one of Al, Mg, Ag, Zn, and Cu.

5. A semiconductor device according to claim 1, wherein the second Cu layer is directly connected to the second intermetallic compound layer and wherein the second intermetallic compound layer is directly connected to the Ni plated on the surface of the frame.

6. A semiconductor device according to claim 2, wherein the second Cu layer is directly connected to the second intermetallic compound layer and wherein the second intermetallic compound layer is directly connected to the Ni plated on the surface of the frame.

* * * * *